United States Patent
Yoshikawa et al.

(10) Patent No.: US 10,424,684 B2
(45) Date of Patent: Sep. 24, 2019

(54) MSM ULTRAVIOLET RAY RECEIVING ELEMENT, MSM ULTRAVIOLET RAY RECEIVING DEVICE

(71) Applicant: ASAHI KASEI KABUSHIKI KAISHA, Tokyo (JP)

(72) Inventors: Akira Yoshikawa, Tokyo (JP); Kazuhiro Nagase, Tokyo (JP); Motoaki Iwaya, Tokyo (JP); Saki Ushida, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/003,591

(22) Filed: Jun. 8, 2018

(65) Prior Publication Data

US 2018/0358500 A1  Dec. 13, 2018

(30) Foreign Application Priority Data

Jun. 13, 2017  (JP) ................... 2017-116187

(51) Int. Cl.
*H01L 29/15* (2006.01)
*H01L 31/0256* (2006.01)
(Continued)

(52) U.S. Cl.
CPC .... *H01L 31/1123* (2013.01); *H01L 31/02005* (2013.01); *H01L 31/022408* (2013.01); *H01L 31/03048* (2013.01); *H01L 31/1085* (2013.01)

(58) Field of Classification Search
USPC ... 257/76, 192, 285, 194, E29.246–E29.253, 257/E21.403, E21.407; 438/167, 172
See application file for complete search history.

(56) References Cited

U.S. PATENT DOCUMENTS 9,780,181 B1 * 10/2017 Teo ................. H01L 29/2003
2004/0130037 A1 * 7/2004 Mishra ............. H01L 21/8252
257/778
(Continued)

FOREIGN PATENT DOCUMENTS

CN       1877868 A    12/2006
CN     102361046 A    2/2012
(Continued)

OTHER PUBLICATIONS

Brendel, et al.; "Solar-blind AlGaN MSM photodetectors with 24% external quantum efficiency at 0 V", Electronics Letters, Oct. 1, 2015, vol. 51, No. 20, pp. 1598-1600.
(Continued)

Primary Examiner — Niki H Nguyen
(74) Attorney, Agent, or Firm — Morgan, Lewis & Bockius LLP

(57) ABSTRACT

An MSM ultraviolet ray receiving element has a low dark state current value and a good photosensitivity. The MSM ultraviolet ray receiving element has a first nitride semiconductor layer on a substrate, a second nitride semiconductor layer on the first nitride semiconductor layer, and first and second electrodes on the second nitride semiconductor layer. The first nitride semiconductor layer contains $Al_X Ga_{(1-X)}N$ ($0.4 \leq X \leq 0.90$). The second nitride semiconductor layer contains $Al_Y Ga_{(1-Y)}N$ with a film thickness t (nm) satisfying $5 \leq t \leq 25$. The first electrode and the second electrode contain a material containing at least three elements of Ti, Al, Au, Ni, V, Mo, Hf, Ta, W, Nb, Zn, Ag, Cr, and Zr. Al composition ratios X and Y and a film thickness t satisfy $-0.009 \times t + X + 0.22 - 0.03 \leq Y \leq -0.009 \times t + X + 0.22 + 0.03$.

20 Claims, 7 Drawing Sheets

(51) Int. Cl.

*H01L 31/112* (2006.01)
*H01L 31/02* (2006.01)
*H01L 31/0224* (2006.01)
*H01L 31/0304* (2006.01)
*H01L 31/108* (2006.01)

(56) References Cited

U.S. PATENT DOCUMENTS

| | | |
|---|---|---|
| 2008/0087914 A1 | 4/2008 | Li et al. |
| 2009/0166674 A1 | 7/2009 | Iwaya et al. |
| 2009/0189188 A1* | 7/2009 | Matsushita ......... H01L 29/1029 |
| | | 257/192 |
| 2010/0237344 A1 | 9/2010 | Schoenfeld |

FOREIGN PATENT DOCUMENTS

| | | |
|---|---|---|
| JP | H11-261016 A | 9/1999 |
| JP | 2000-183373 A | 6/2000 |
| JP | 2010-073814 A | 4/2010 |
| JP | 2010-080481 A | 4/2010 |
| JP | 2017-092155 A | 5/2015 |
| WO | 2007/135739 A1 | 11/2007 |

OTHER PUBLICATIONS

Martens et al., "High gain ultraviolet photodetectors based on AlGaN/GaN heterostructures for optical switching", Applied Physics Letters 98, 211114 (2011).

* cited by examiner

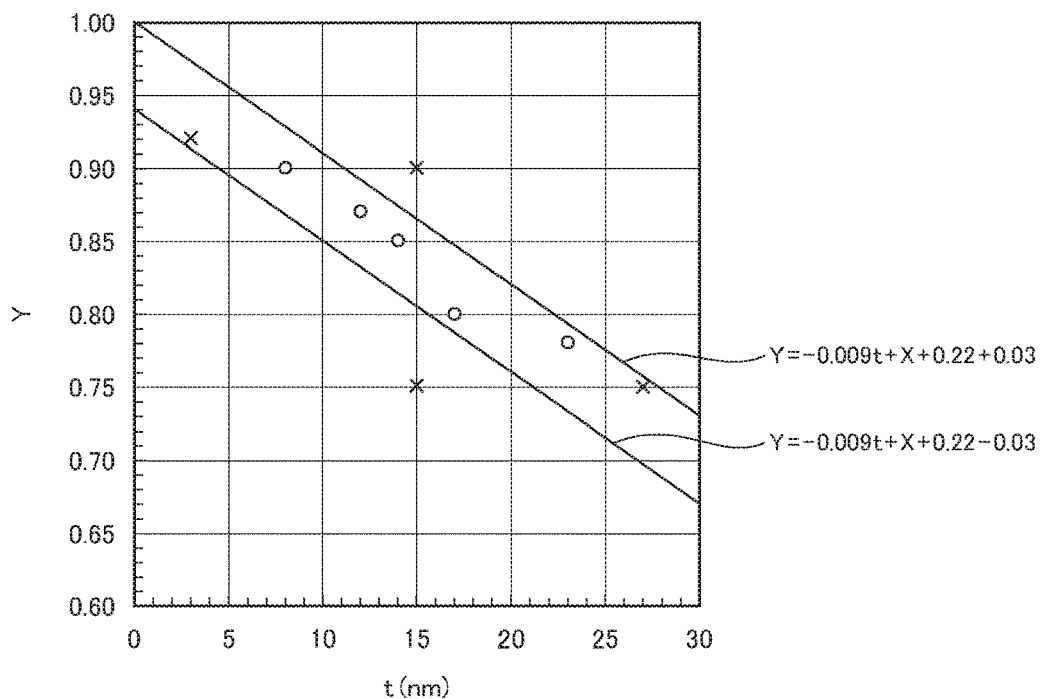
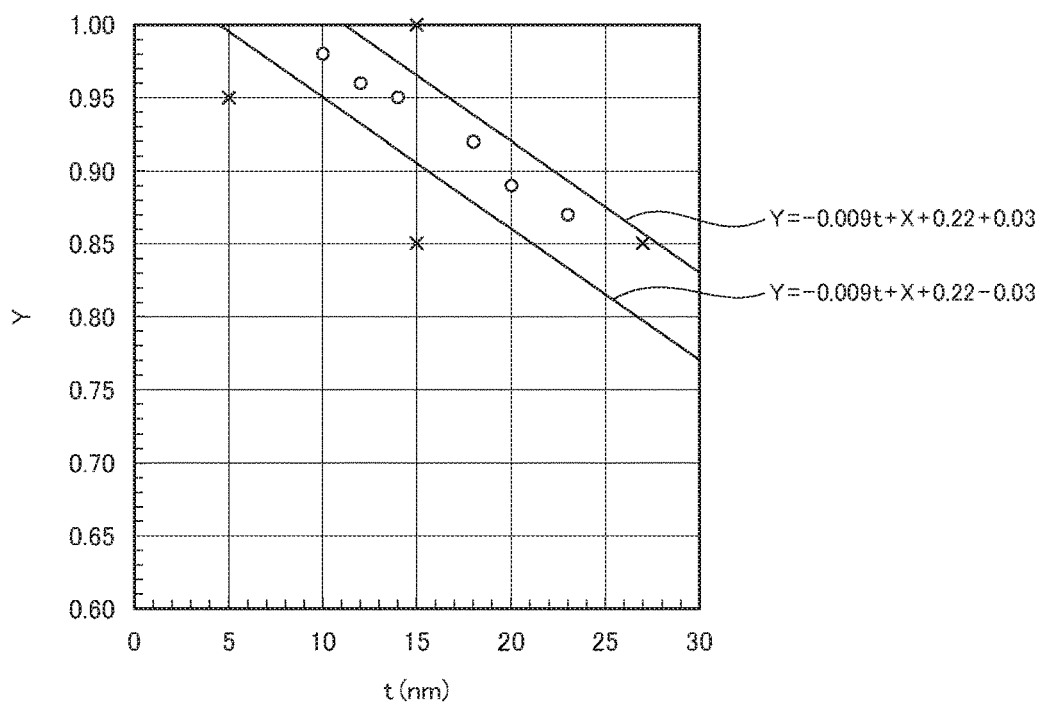

MSM ULTRAVIOLET RAY RECEIVING ELEMENT, MSM ULTRAVIOLET RAY RECEIVING DEVICE

BACKGROUND OF THE INVENTION

Field of the Invention

The present invention relates to an MSM (metal-semiconductor-metal) ultraviolet ray receiving element.

Description of the Related Art

As an example of an ultraviolet ray receiving element, an ultraviolet ray receiving element containing a p-type gate optical FET using a GaN/AlGaN heterostructure is known (for example, see Patent Document 1).

CITATION LIST

Patent Literature

PTL 1: WO 2007/135739

SUMMARY OF THE INVENTION

In the above-described ultraviolet ray receiving element, a p-type GaN-based semiconductor layer depleting a two-dimensional electron gas layer is present on the outermost surface of a light receiving surface (light incident surface). Due to the presence of the layer, a current value in a dark state (state where light to be received is not made incident) can be made excessively low but there is a problem that the photosensitivity decreases by the absorption of a part of incident light by the layer when the light is incident (when light to be received is made incident).

It is an object of the present invention to provide an MSM ultraviolet ray receiving element in which a current value in the dark state is excessively low and the photosensitivity when light is incident is also good.

To solve the above-described problems, an MSM ultraviolet ray receiving element which is one aspect of the present invention has a substrate, a first nitride semiconductor layer formed on the substrate and containing $Al_XGa_{(1-X)}N$ ($0.45 \leq X \leq 0.90$), a second nitride semiconductor layer formed on the first nitride semiconductor layer, containing $Al_YGa_{(1-Y)}N$ ($Y \leq 1$), and having a film thickness t (nm) satisfying $5 \leq t \leq 25$, and a first electrode and a second electrode (source electrode and drain electrode) formed on the second nitride semiconductor layer and containing a material containing at least three elements of Ti, Al, Au, Ni, V, Mo, Hf, Ta, W, Nb, Zn, Ag, Cr, and Zr. An Al composition ratio X of the first nitride semiconductor layer, and an Al composition ratio Y and a film thickness t of the second nitride semiconductor layer satisfy the following Expression (1);

$$-0.009 \times t + X + 0.22 - 0.03 \leq Y \leq -0.009 \times t + X + 0.22 + 0.03 \quad (1).$$

The "MSM ultraviolet ray receiving element" in the present invention refers to an ultraviolet ray receiving element in which a dark current (current flowing in the dark state) when the source-drain voltage is set to 3 V is $1.0 \times 10^{-8}$ A/mm or less.

One aspect of the present invention can provide an MSM ultraviolet ray receiving element in which a current value in the dark state is excessively low and the photosensitivity when light is incident is also good.

BRIEF DESCRIPTION OF THE DRAWINGS

FIG. 8 is a graph created from the data of Examples and illustrates the relationship between the Al composition ratio Y and the film thickness t of the second nitride semiconductor layer when the Al composition ratio X of the first nitride semiconductor layer is 0.75.

FIG. 9 is a graph created from the data of Examples and illustrates the relationship between the Al composition ratio Y and the film thickness t of the second nitride semiconductor layer when the Al composition ratio X of the first nitride semiconductor layer is 0.85.

DESCRIPTION OF THE PREFERRED EMBODIMENTS

Figure 1:
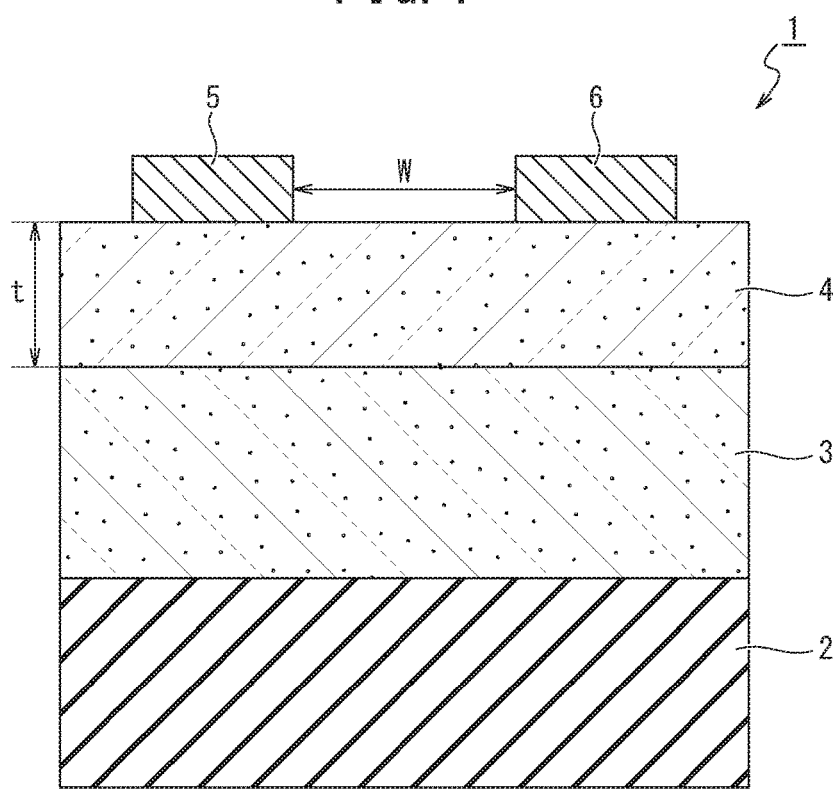
FIG. 1 is a cross-sectional view illustrating an MSM ultraviolet ray receiving element of an embodiment.

[Actions and Effects of Ultraviolet Ray Receiving Element of One Aspect]

An MSM ultraviolet ray receiving element which is one aspect of the present invention (hereinafter referred to as "ultraviolet ray receiving element of one aspect") can lower the carrier concentration of a two-dimensional electron gas layer on the interface between a first nitride semiconductor layer and a second nitride semiconductor layer in a dark state (state where ultraviolet rays are not incident) to $1 \times 10^{10}$ cm$^{-3}$ or less, for example, due to the fact that an Al composition ratio X of the first nitride semiconductor layer, and an Al composition ratio Y and a film thickness t of the second nitride semiconductor layer satisfy Expression (1) above.

When the carrier concentration of the two-dimensional electron gas layer in the dark state is high, a high current value flows between a source and a drain. The current (dark current) flowing in the dark state becomes a noise, which reduces the S/N (photocurrent/dark current) of the light receiving element. The ultraviolet ray receiving element of one aspect reduces the noise by lowering the carrier concentration of the two-dimensional electronic layer in the dark state in such a manner that only a very slight current flows between the source and the drain.

In the ultraviolet ray receiving element of one aspect, the first electrode and the second electrode serving as a source electrode and a drain electrode contain materials containing at least three elements of Ti, Al, Au, Ni, V, Mo, Hf, Ta, W, Nb, Zn, Ag, Cr, and Zr which are materials having low contact resistance. Thus, a Schottky junction is formed between the second nitride semiconductor layer, and the source electrode and the drain electrode, and therefore the current between the source and the drain in the dark state further decreases. On the other hand, when ultraviolet rays are incident on the second nitride semiconductor layer, the carrier concentration of the two-dimensional electron gas layer increases, and thus the Schottky junction between the source electrode and the drain electrode, and the second nitride semiconductor layer disappears. Thus, when light is incident, a photocurrent as high as more than $10^{-7}$ A/mm, for example, is obtained.

Thus, the ultraviolet ray receiving element of the present invention achieves both the prevention effect of the dark current (noise) and the increase effect of the photocurrent (signal), and therefore can obtain a very high S/N.

In the ultraviolet ray receiving element of one aspect, the first nitride semiconductor layer contains $Al_XGa_{(1-X)}N$ ($0.45 \leq X \leq 0.90$). By setting the Al composition ratio X of the first nitride semiconductor layer to 0.45 or more and 0.90 or less, the sensitivity to light with a wavelength of 290 nm or more contained in the sunlight or a fluorescent light can be reduced (solar blind).

The description "the first nitride semiconductor layer contains $Al_XGa_{(1-X)}N$ ($0.45 \leq X \leq 0.90$)" means that most of the first nitride semiconductor layer contains $Al_XGa_{(1-X)}N$ ($0.45 \leq X \leq 0.90$) but the other materials are sometimes contained. For example, the description means that elements other than Al, Ga, and N (for example, dopants, such as Group III elements, such as In, or Mg, Si and the like) are sometimes contained to such an extent (about several percent) that the characteristics of the first nitride semiconductor layer containing $Al_XGa_{(1-X)}N$ ($0.45 \leq X \leq 0.90$) are not affected.

In the ultraviolet ray receiving element of one aspect, the second nitride semiconductor layer contains $Al_YGa_{(1-Y)}N$ ($Y \leq 1$), the film thickness t (nm) satisfies $5 \leq t \leq 25$, and the Al composition ratio Y of the second nitride semiconductor layer satisfies Expression (1). For example, when the Al composition ratio X of the first nitride semiconductor layer is 0.45 and the film thickness t of the second nitride semiconductor layer is 5 nm, the Al composition ratio Y of the second nitride semiconductor layer takes a value of 0.655 or more and 0.715 or less.

The description "the second nitride semiconductor layer contains $Al_YGa_{(1-Y)}N$" means that most of the second nitride semiconductor layers contains $Al_YGa_{(1-Y)}N$ but the other materials are sometimes contained. For example, the description means that elements other than Al, Ga, and N (for example, dopants, such as Group III elements, such as In, or Mg, Si and the like) are contained to such an extent (about several percent) that the characteristics of the second nitride semiconductor layer containing $Al_YGa_{(1-Y)}N$ are not affected. In the ultraviolet ray receiving element of one aspect, ultraviolet rays may be made incident from the side of a substrate or may be made incident from the second nitride semiconductor layer side.

[Supplementary Description about Each Configuration of Ultraviolet Ray Receiving Element of One Aspect]

<Substrate>

The substrate is not particularly limited insofar as the first nitride semiconductor layer can be formed on the substrate. Specifically, Si, SiC, MgO, $Ga_2O_3$, $Al_2O_3$, ZnO, GaN, InN, AlN, or a mixed crystal substrate thereof and the like are mentioned as the substrate. Impurities may be mixed in the substrate.

<Method for Confirming Compositions of First and Second Nitride Semiconductor Layers>

(Method for Confirming Elements Contained in First and Second Nitride Semiconductor Layers)

Elements contained in the first and second nitride semiconductor layers can be confirmed by X-ray fluorescence analysis (XRF), Rutherford backscattering spectrometry (RBS), secondary ion mass spectrometry (SIMS), and X-ray photoelectron spectroscopy (XPS).

(Method for Measuring Al Composition Ratio X of $Al_XGa_{(1-X)}N$ of First Nitride Semiconductor Layer)

The Al composition ratio (X) of $Al_XGa_{(1-X)}N$ of the first nitride semiconductor layer can be measured by performing 2θ-ω scan and reciprocal lattice mapping measurement (RSM) by an X-ray diffraction (XRD) method.

Specifically, first, the 2θ-ω scan is performed for the plane of a plane index corresponding to the plane direction of the substrate by the X-ray diffraction, and then the lattice constant of $Al_XGa_{(1-X)}N$ of the first nitride semiconductor layer is determined from the peak position.

Herein, when the substrate is a substrate cut in a predetermined plane direction with good accuracy (just substrate), the 2θ-ω scan can be performed for the plane of a plane index corresponding to the plane direction of the just substrate, and then the lattice constant can be determined from the peak position as described above. When the substrate is a substrate cut giving an off-angle from a predetermined plane direction (off-substrate), the 2θ-ω scan needs to be performed by making X-rays incident from an angle shifted corresponding to the off-angle from the surface of the off-substrate.

Next, the X (Al composition ratio) of $Al_XGa_{(1-X)}N$ is determined from the obtained lattice constant of $Al_XGa_{(1-X)}N$ using the Vegard's rule. The Vegard's rule is specifically expressed by the following Expression (3);

$$a_{AB} = Xa_A + (1-X)a_B \qquad (3).$$

In Expression (3), $a_A$ represents the lattice constant of AlN, $a_B$ denotes the lattice constant of GaN, and $a_{AB}$ denotes the lattice constant of $Al_XGa_{(1-X)}N$. Herein, for $a_A$ and $a_B$, the values ($a_A$=3.112 Å, $a_B$=3.189 Å) described in "S. Strite and. H. Morko, GaN, AlN, and InN: A review Journal of Vacuum Science & Technology B 10, 1237(1992); doi-ASD: 10.1116/1.585897" are usable.

Therefore, a value of the X (Al composition ratio) can be determined from Expression (3) using $a_A$=3.112 Å, $a_B$=3.189 Å, and the value ($a_{AB}$) of the obtained lattice constant of $Al_XGa_{(1-X)}N$.

On the other hand, the relaxation ratio cannot be determined only by the 2θ-ω scan, and therefore a correct X (Al composition ratio) cannot be calculated. It is useful to perform the reciprocal lattice mapping in asymmetrical planes, such as a (10-15) plane and a (20-24) plane. Specifically, a point where the 2θ-ω peak of the substrate reaches the maximum is measured in the (20-24) plane in which the substrate and the $Al_XGa_{(1-X)}N$ layer are most separated from each other in the reciprocal lattice space. The 2θ-ω is scanned while changing ω in increments of 0.01° from the point. The process above is repeated, and then the obtained Qx and Qy are mapped, whereby the ratio in which the $Al_XGa_{(1-X)}N$ layer is relaxed to the substrate can be calculated. Based on the relaxation ratio and the lattice constant calculated above, a correct X (Al composition ratio) can be obtained.

(Method for Measuring Al Composition Ratio Y of $Al_YGa_{(1-Y)}N$ of Second Nitride Semiconductor Layer)

The Al composition ratio Y of the second nitride semiconductor layer can also be determined by the same method as the method for measuring the Al composition ratio (X) of the first nitride semiconductor layer.

[Preferable Aspect of Ultraviolet Ray Receiving Element of One Aspect]

It is preferable in the ultraviolet ray receiving element of one aspect that the first nitride semiconductor layer contains $Al_XGa_{(1-X)}N$ $(0.48 \leq X \leq 0.60)$ It is preferable in the ultraviolet ray receiving element of one aspect that the film thickness t of the second nitride semiconductor layer satisfies $10 \leq t \leq 20$.

It is preferable in the ultraviolet ray receiving element of one aspect that the first electrode and the second electrode each include a comb-like portion from a base portion of which a plurality of teeth projects and the teeth of the first electrode and the teeth of the second electrode are arranged to be alternately adjacent to each other as viewed in plan.

It is preferable in the ultraviolet ray receiving element of one aspect that the first electrode and the second electrode contain at least Al, Mo, and Au.

It is preferable in the ultraviolet ray receiving element of one aspect that the film thickness of the first nitride semiconductor layer is 20 nm or more and 1000 nm or less.

It is preferable in the ultraviolet ray receiving element of one aspect that a two-dimensional electron gas layer with an electron density of $1 \times 10^{11}$ cm$^{-2}$ or more and $6 \times 10^{12}$ cm$^{-2}$ or less is present on the interface between the first nitride semiconductor layer and the second nitride semiconductor layer. The thickness of the two-dimensional electron gas layer is preferably 2 nm or more and 30 nm or less.

The thickness and the carrier concentration of the two-dimensional electron gas layer induced on the interface of the nitride semiconductor layer and the second nitride semiconductor layer are determined by the Capacitance-voltage (C-V) measurement.

It is preferable in the ultraviolet ray receiving element of one aspect that the wavelength λ (nm) of the luminescence caused by photoluminescence and the Al composition ratio X of the first nitride semiconductor layer satisfy the following Expression (2);

$$1.24 \times 10^{-3}/(X^2+1.86X+3.42)-10 \leq \lambda \leq 1.24 \times 10^{-3}/(X^2+1.86X+3.42)+10 \quad (2).$$

In the ultraviolet ray receiving element of one aspect, the Schottky barrier is formed on the interface of metal and the nitride semiconductor by light irradiation. The height ($\phi_B$) of the Schottky barrier and the saturation current value ($I_s$) have a relationship given by the following expression (4), and therefore the height ($\phi_B$) of the Schottky barrier is calculated using Expression (4). A value of the saturation current value ($I_s$) is defined as a current value of the intercept when an approximation straight line is drawn from a region where the current is saturated.

$$I_s = S \times A^* \times T^2 \times \exp(-\phi_B/kT) \quad (4)$$

In Expression (4), S indicates the light reception area, $A^*$ indicates the Richardson constant, T indicates the absolute temperature, and k indicates Boltzmann constant.

It is preferable in the ultraviolet ray receiving element of one aspect that the height of the Schottky barrier in the irradiation with ultraviolet rays with a wavelength of 250 nm is 0.1 eV or more and 0.5 eV or less.

It is preferable in the ultraviolet ray receiving element of one aspect that the distance between the first electrode and the second electrode is 1.0 μm or more and 30 μm or less. One of the first electrode and the second electrode serves as the source electrode and the other electrode serves as the drain electrode.

It is preferable in the ultraviolet ray receiving element of one aspect that the distance between the source electrode and the drain electrode (hereinafter referred to as "SD distance") is 1.0 μm or more and 30 μm or less. The source electrode and the drain electrode apply a bias voltage to the ultraviolet ray receiving element, and then extract a current generated by incident light. By setting the SD distance to 1.0 μm or more and 30 μm or less, a sufficient bias voltage can be applied to the ultraviolet ray receiving element.

The substrate configuring the ultraviolet ray receiving element of one aspect is preferably any one of a sapphire substrate, an AlN substrate, and a GaN substrate. The substrates can grow the first nitride semiconductor layer in the lattice-matched system because a lattice constant difference from the first nitride semiconductor layer is small, and therefore the threading dislocation can be reduced.

It is preferable in the ultraviolet ray receiving element of one aspect that the photosensitivity is $1 \times 10^5$ A/W or more and the ratio (S/N) of the photocurrent to the dark current is $1 \times 10^4$ or more in the irradiation with ultraviolet rays with a wavelength of 250 nm.

The substrate configuring the ultraviolet ray receiving element of one aspect is preferably an AlN substrate or a sapphire substrate and the absorption coefficient to ultraviolet rays with a wavelength of 265 nm of the substrate is 5 cm$^{-1}$ or more and 50 cm$^{-1}$ or less.

It is preferable in the ultraviolet ray receiving element of one aspect that the light reception area is 500 μm$^2$ or more and 15000 μm$^2$ or less.

It is preferable in the ultraviolet ray receiving element of one aspect that the relaxation ratio to the substrate in the (10-12) plane which is an asymmetrical plane of crystal configuring the first nitride semiconductor layer is 0% or more and 5% or less.

It is preferable in the ultraviolet ray receiving element of one aspect that the half value width of an XRD rocking curve in the (10-12) plane which is an asymmetrical plane of crystal configuring the first nitride semiconductor layer is 50 arcsec or more and 1000 arcsec or less.

It is preferable in the ultraviolet ray receiving element of one aspect that the fall time (speed of response) in the irradiation with ultraviolet rays with a wavelength of 250 nm is 0.1 μsec or more and 1 msec or less.

The speed of response can be confirmed by the following method. In a state where a 3 V constant voltage is applied to the ultraviolet ray receiving element of one aspect, the ultraviolet ray receiving element of one aspect is sufficiently irradiated with ultraviolet rays with a wavelength of 280 nm or less in which the intensity is adjusted to 10 μW/cm$^2$, and then the irradiation with the ultraviolet rays is stopped. The time required for the current value to attenuate by 1/e times a value before stopping the irradiation from the time of stopping the irradiation is measured as the falling time.

It is preferable in the ultraviolet ray receiving element of one aspect that no gate electrode is present on the second nitride semiconductor layer. This makes it possible to eliminate the absorption of ultraviolet rays by the gate electrode, and thus the photosensitivity is improved and element formation processes can be reduced. Herein, the gate electrode means an electrode provided between the source electrode and the drain electrode and having a function of adjusting the carrier concentration of the two-dimensional electron gas layer by the application of a gate voltage, pn junction by doping, or the like.

It is preferable in the ultraviolet ray receiving element of one aspect that the photosensitivity is $1 \times 10^5$ A/W or more and the ratio (S/N) of the photocurrent to the dark current is $1 \times 10^4$ or more when light with a wavelength of 290 nm or less is incident.

It is preferable in the ultraviolet ray receiving element of one aspect that, only when light with a wavelength of 290 nm or less is made incident, a current of $10^{-7}$ A/mm or more flows between the source electrode and the drain electrode. Such an ultraviolet ray receiving element has high selectivity of the wavelength of received light.

Furthermore, in the ultraviolet ray receiving element of one aspect, the photosensitivity when light with a wavelength of 290 nm or less is incident is larger by preferably $1 \times 10^4$ A/W or more and more preferably $1 \times 10^5$ A/W or more than the photosensitivity when light with a wavelength of more than 290 nm is incident. Such an ultraviolet ray receiving element has particularly high selectivity of the wavelength of received light.

[Other Descriptions for Ultraviolet Ray Receiving Element of One Aspect]

<First Nitride Semiconductor Layer>

As described above, the film thickness of the first nitride semiconductor layer is preferably 20 nm or more and 1000 nm or less and more preferably 50 nm or more and 900 nm or less.

From the viewpoint of forming the two-dimensional electron gas layer on the interface between the first nitride semiconductor layer and the second nitride semiconductor layer, the first nitride semiconductor layer is preferably undoped. Herein, the "undoped" means a state where the concentration of impurities is less than $1 \times 10^{16}$ cm$^{-3}$. Also when using the wording "undoped" in the others case, the "undoped" has the same meaning.

<Second Nitride Semiconductor Layer>

As a method for evaluating the film thickness of the second nitride semiconductor layer, a cross-sectional transmission electron microscope (TEM) is mentioned.

In the ultraviolet ray receiving element of one aspect, the film thickness of the second nitride semiconductor layer is set to 5 μm or more and 25 μm or less and is preferably 8 nm or more and 20 nm or less and more preferably 10 nm or more and 15 nm or less.

From the viewpoint of securing crystallinity, the second nitride semiconductor layer is preferably undoped.

<Buffer Layer>

The ultraviolet ray receiving element of one aspect may further have a buffer layer between the substrate and the first nitride semiconductor layer. Thus, the crystallinity of the first nitride semiconductor layer is improved, and the photosensitivity can be further increased. As materials of the buffer layer, AlN, AlGaN, and the like are usable.

<First Electrode, Second Electrode>

Materials of the first electrode and the second electrode are particularly preferably alloys containing V, Al, Mo, and Au from the viewpoint of a contact resistance reduction. In this case, as a method for forming the first electrode and the second electrode, a method is mentioned which includes depositing V with a film thickness of 10 nm or more and 30 nm or less, Al with a film thickness of 70 nm or more and 90 nm or less, Mo with a film thickness of 30 nm or more and 50 nm or less, and Au with a film thickness of 40 nm or more and 60 nm or less in this order on the second nitride semiconductor layer, and then performing heat treatment under the conditions of a temperature range of 600° C. or more and 900° C. or less, a temperature rise rate of 7.5° C./sec or more and 20° C./sec or less, and time of 30 seconds or more and 300 seconds or less.

It is also preferable to use Ni with a film thickness of 30 nm or more and 50 nm or less in place of Mo.

<Surface Protective Layer>

The ultraviolet ray receiving element of one aspect may have a surface protective layer. The surface protective layer includes $SiO_2$, SiN, $Al_2O_3$, AlN, and the like the surface protective layer is not limited thereto.

<Method for Producing Ultraviolet Ray Receiving Element>

A method for producing the ultraviolet ray receiving element of one aspect includes a process of depositing the first nitride semiconductor layer on the substrate using a metal organic chemical vapor deposition method (MOCVD method), a process of depositing the second nitride semiconductor layer on the first nitride semiconductor layer, and a process of forming the source electrode and the drain electrode on the second nitride semiconductor layer (surface opposite to the first nitride semiconductor layer of the second nitride semiconductor layer).

The first nitride semiconductor layer and the second nitride semiconductor layer can be formed using Al raw materials containing trimethylaluminum (TMAl), for example, Ga raw materials containing trimethylgallium (TMGa), triethylgallium (TEGa), and the like, for example, and N raw materials containing ammonia ($NH_3$), for example.

A method for forming the first electrode and the second electrode on the second nitride semiconductor layer includes various methods, such as a method including vapor-depositing metal using a resist mask by an electron beam deposition (EB) method.

EMBODIMENT

Hereinafter, an aspect for implementing the present invention (hereinafter referred to as "embodiment") is described but the present invention is not limited to the embodiment described below. The embodiment described below is technically preferably limited to implement the present invention but the limitation is not the indispensable requirements of the present invention. The figures are schematically illustrated, and the thickness of each layer is different from the actual thickness and the ratio of each layer is also different from the actual ratio. Specific thickness and dimensions should be determined considering the description of this embodiment or Examples.

As illustrated in FIG. 1, the MSM ultraviolet ray receiving element 1 of the embodiment has the substrate 2, the first nitride semiconductor layer 3 formed on the substrate 2, the second nitride semiconductor layer 4 formed on the first nitride semiconductor layer 3, and the first electrode 5 and the second electrode 6 formed on the second nitride semiconductor layer 4. One of the first electrode 5 and the second electrode 6 serves as the source electrode and the other electrode serves as the drain electrode. In the following description, the first electrode 5 is referred to as the source electrode and the second electrode 6 is referred to as the drain electrode.

The substrate 2 contains a sapphire substrate. The first nitride semiconductor layer 3 is a layer containing $Al_XGa_{(1-X)}N$ ($0.45 \leq X \leq 0.60$). The film thickness of the first nitride semiconductor layer 3 is 20 nm or more and 1000 nm or less. A buffer layer containing AlN is provided between the substrate 2 and the first nitride semiconductor layer 3. The second nitride semiconductor layer 4 is a layer containing $Al_YGa_{(1-Y)}N$ and the film thickness t (nm) of the second nitride semiconductor layer 4 is 5 or more and 25 or less.

The Al composition ratio X of the first nitride semiconductor layer 3, and the Al composition ratio Y and the film thickness t of the second nitride semiconductor layer 4 satisfy the following Expression (1);

$$-0.009 \times t + X + 0.22 - 0.03 \leq Y \leq -0.009 \times t + X + 0.22 + 0.03 \quad (1).$$

The source electrode 5 and the drain electrode 6 are alloys obtained by heat-treating a laminate in which V, Al, Mo, and Au are deposited in this order from the second nitride semiconductor layer 4 side. An SD distance W (distance between the source electrode 5 and the drain electrode 6) is 1.0 μm or more and 30 μm or less.

No gate electrode is present on the second nitride semiconductor layer 4.

According to the MSM ultraviolet ray receiving element 1 of the embodiment, the carrier concentration of the two-dimensional electron gas layer on the interface between the first nitride semiconductor layer 3 and the second nitride semiconductor layer 4 in the dark state can be lowered to $1 \times 10^{10}$ cm$^{-3}$ or less, for example. When light is incident, a photocurrent as high as more than $10^{-7}$ A/mm is obtained, for example. Thus, the MSM ultraviolet ray receiving element 1 of the embodiment can achieve both the prevention effect of the dark current (noise) and the increase effect of the photocurrent (signal), and therefore can obtain a very high S/N.

Figure 2:
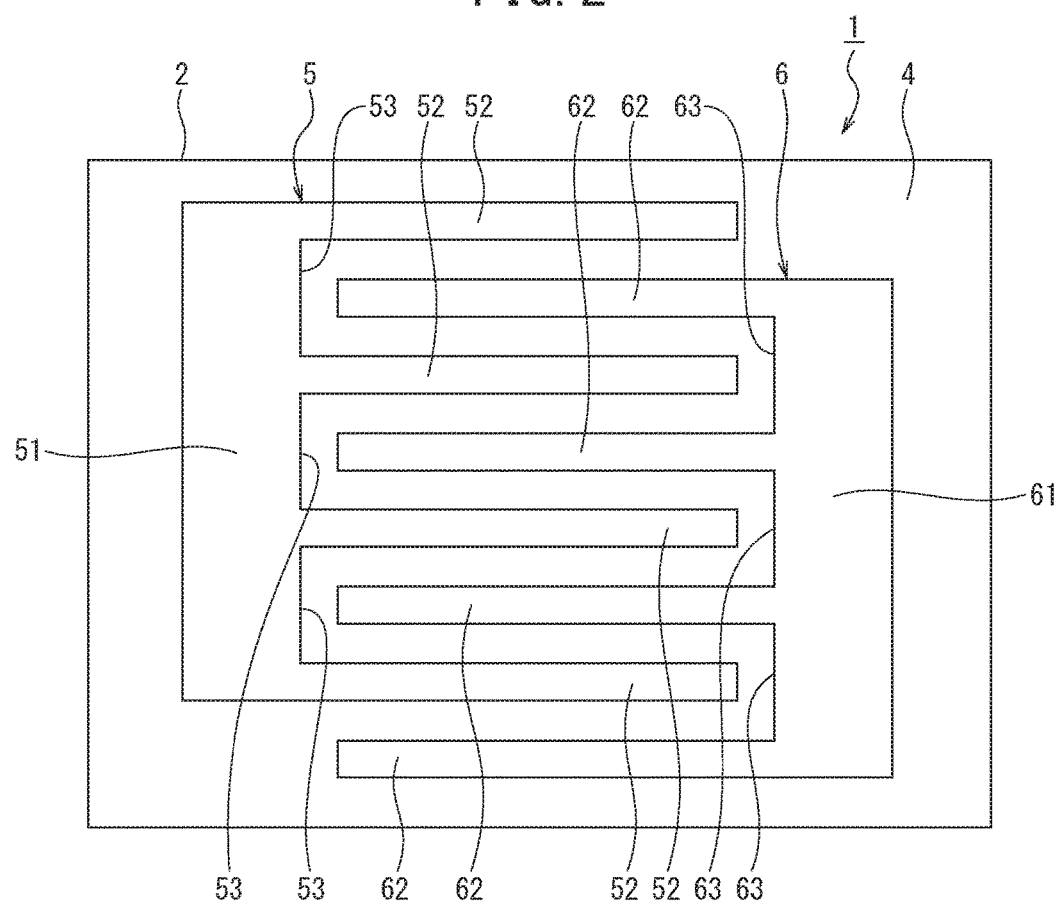
FIG. 2 is a plan view illustrating the shape of and the arrangement of electrodes in the MSM ultraviolet ray receiving element of the embodiment.

In the MSM ultraviolet ray receiving element 1 of the embodiment, the source electrode 5 and the drain electrode 6 may have the shape and the arrangement illustrated in FIG. 2 as viewed in plan. More specifically, the source electrode 5 and the drain electrode 6 each have a comb-like plane shape from base portions 51 and 61 of which a plurality of teeth 52 and 62 projects. In this example, the direction in which the base portions 51 and 61 extend and the projection direction of the teeth 52 and 62 are perpendicular. Due to the fact that the teeth 62 of the drain electrode 6 enter recessed portions 53 formed by the two teeth 52 adjacent to each other and the base portion 51 of the source electrode 5 and the teeth 52 of the source electrode 5 enter recessed portions 63 formed by the teeth 62 adjacent to each other and the base portion 61 of the drain electrode 6, the teeth 52 of the source electrode 5 and the teeth 62 of the drain electrode 6 are arranged to be alternately adjacent to each other. The teeth 52 and 62 are disposed in parallel to each other.

Figure 3:
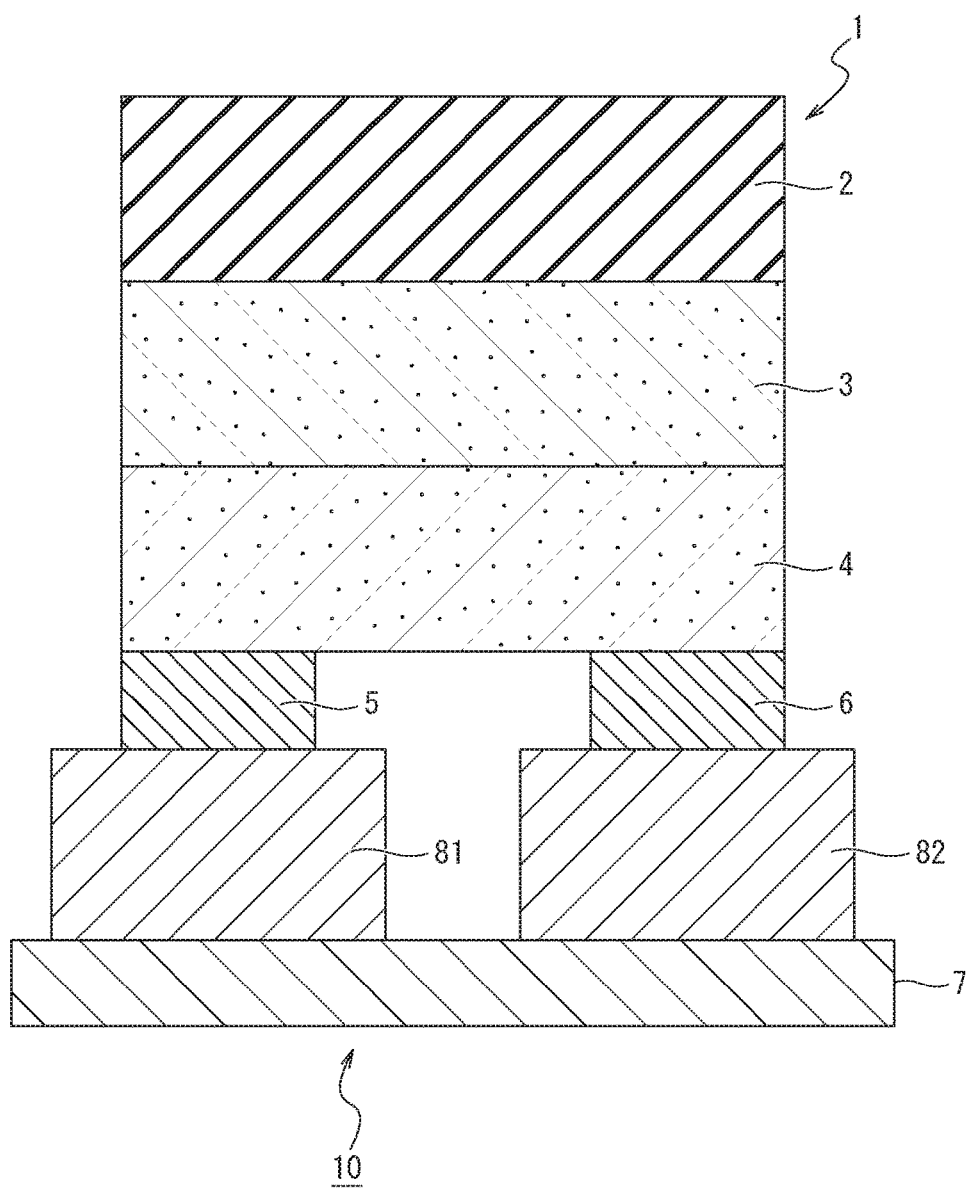
FIG. 3 is a cross-sectional view illustrating an MSM ultraviolet ray receiving device of an embodiment.

The MSM ultraviolet ray receiving element 1 of the embodiment can be flip-chip mounted on a mounting substrate 7 as illustrated in FIG. 3 to be used. More specifically, the MSM ultraviolet ray receiving device 10 illustrated in FIG. 3 is obtained by flip-chip mounting the MSM ultraviolet ray receiving element 1 on the mounting substrate 7 through a conductive substrate or support electrodes 81 and 82. The source electrode 5 and the drain electrode 6 are electrically connected to the mounting substrate 7 by the conductive substrate or the support electrodes 81 and 82, respectively.

EXAMPLES

Hereinafter, Examples and Comparative Examples of the present invention are described.

Ultraviolet ray receiving elements of Examples 1 to 55 and Comparative Examples 1 to 28 have the substrate 2 containing sapphire, the first nitride semiconductor layer 3, the second nitride semiconductor layer 4, the source electrode 5, and the drain electrode 6 and have a buffer layer between the substrate 2 and the first nitride semiconductor layer 3 as with the MSM ultraviolet ray receiving element 1 of the embodiment illustrated in FIG. 1.

Example 1

On a substrate containing a 2 inch sapphire wafer, an AlN layer (buffer layer) was grown by 3 μm by a metal organic chemical vapor deposition method in a state where the surface temperature of the substrate was maintained at 1250° C. Next, a first nitride semiconductor layer containing $Al_XGa_{(1-X)}N$ (X=0.47) was grown by 150 nm on the AlN layer in a state where the surface temperature of the AlN layer was maintained at 1050° C. Next, a second nitride semiconductor layer containing $Al_YGa_{(1-Y)}N$ (Y=0.65) was grown by 6 nm on the first nitride semiconductor layer 3 in a state where the surface temperature of the first nitride semiconductor layer 3 was maintained at 1050° C.

Next, the substrate of this state was cleaned, and then a resist mask having a plurality of opening portions of 450 μm×450 μm was formed on the second nitride semiconductor layer. Next, mesa isolation was performed using the resist mask and an inductively coupled plasma (ICP) etching device to thereby electrically insulate a plurality of elements formed on the wafer.

Next, the resist mask was removed, and then a laminate forming a source electrode and a drain electrode at an interval of 20 μm was formed on the second nitride semiconductor layer by an EB deposition method to each element. Specifically, V, Al, Mo, and Au were deposited in this order from the second nitride semiconductor layer side, and the film thickness of each layer was set as follows: V: 20 nm, Al: 80 nm, Mo: 50 nm, and Au: 40 nm.

Next, the resist mask was removed, and then an annealing process of "increasing the temperature to 700° C. in 40 seconds, maintaining the temperature for 30 seconds, and then lowering the temperature using an infrared lamp annealing device" was performed. Thus, the source electrode and the drain electrode containing alloys containing V, Al, Mo, and Au were formed.

Next, the sapphire wafer was subjected to dicing, whereby a plurality of ultraviolet ray receiving elements was obtained.

The characteristics of the obtained ultraviolet ray receiving elements were measured by the following methods.

For the measurement of a current (photocurrent) when ultraviolet rays are incident, an artificial sunlight source was used as a light source and a spectroscope was used in combination. Then, the upper surface of the second nitride semiconductor layer was irradiated with ultraviolet light with a wavelength of 250 nm at an intensity of 10 μW/cm$^2$ to measure a current flowing between the source and drain electrodes when the source-drain voltage is set to 3 V. The measurement of a current (dark current) in a dark state where no ultraviolet irradiation was performed was also performed at a source-drain voltage of 3 V. For the current voltage measurement, a parameter analyzer and a probe measuring instrument were used.

As a result of the measurement, the dark current was $1.0 \times 10^{-11}$ A/mm (detection limit) and the photocurrent was $3.0 \times 10^{-5}$ A/mm. The photosensitivity obtained by converting the photocurrent was $3 \times 10^5$ A/W. A ratio (photocurrent/dark current) of the photocurrent value (current value in 250 nm ultraviolet light irradiation) to the obtained dark current value was $3.0 \times 10^6$. The speed of response (fall time) in the ultraviolet light irradiation (when light is incident) was 1 μsec or less.

The configurations (Y and t) of the ultraviolet ray receiving element of Example 1 and the measurement results are given in the following Table 1 together with the following Examples 2 to 43.

Examples 2 to 43

Ultraviolet ray receiving elements of Examples 2 to 43 were created by the same method as that of Example 1, except setting the Al composition ratio X of the first nitride semiconductor layer containing $Al_XGa_{(1-X)}N$, the Al composition ratio Y of the second nitride semiconductor layer containing $Al_YGa_{(1-Y)}N$, and the film thickness t to values given in Table 1, and then the characteristics of the ultraviolet ray receiving elements were measured by the above-described method. The measurement results are also given in Table 1.

TABLE 1

| | Configuration | | | Measurement results | | | |
|---|---|---|---|---|---|---|---|
| | X | Y | t (nm) | Dark current (A/mm) | Photocurrent (A/mm) | S/N | Photosensitivity (A/W) |
| Ex. 1 | 0.47 | 0.65 | 6 | 1.0E−11 | 3.0E−05 | 3.0E+06 | 3.0E+05 |
| Ex. 2 | 0.47 | 0.62 | 8 | 1.0E−11 | 7.0E−05 | 7.0E+06 | 7.0E+05 |
| Ex. 3 | 0.47 | 0.61 | 10 | 1.0E−11 | 2.0E−04 | 2.0E+07 | 2.0E+06 |
| Ex. 4 | 0.47 | 0.58 | 12 | 1.0E−11 | 2.5E−04 | 2.5E+07 | 2.5E+06 |
| Ex. 5 | 0.47 | 0.57 | 14 | 1.0E−11 | 1.5E−04 | 1.5E+07 | 1.5E+06 |
| Ex. 6 | 0.47 | 0.55 | 17 | 1.0E−11 | 1.0E−04 | 1.0E+07 | 1.0E+06 |
| Ex. 7 | 0.47 | 0.53 | 18 | 9.0E−10 | 3.0E−04 | 3.3E+05 | 3.0E+06 |
| Ex. 8 | 0.47 | 0.51 | 20 | 2.0E−09 | 7.0E−05 | 3.5E+04 | 7.0E+05 |
| Ex. 9 | 0.47 | 0.50 | 23 | 2.0E−09 | 8.0E−06 | 4.0E+03 | 8.0E+04 |
| Ex. 10 | 0.52 | 0.70 | 6 | 1.0E−11 | 1.0E−05 | 1.0E+06 | 1.0E+05 |
| Ex. 11 | 0.52 | 0.65 | 10 | 1.0E−11 | 6.0E−05 | 6.0E+06 | 6.0E+05 |
| Ex. 12 | 0.52 | 0.63 | 12 | 1.0E−11 | 4.0E−04 | 4.0E+07 | 4.0E+06 |
| Ex. 13 | 0.52 | 0.63 | 14 | 1.0E−11 | 1.0E−04 | 1.0E+07 | 1.0E+06 |
| Ex. 14 | 0.52 | 0.60 | 15 | 1.0E−11 | 3.0E−04 | 3.0E+07 | 3.0E+06 |
| Ex. 15 | 0.52 | 0.59 | 17 | 1.0E−11 | 1.0E−04 | 1.0E+07 | 1.0E+06 |
| Ex. 16 | 0.52 | 0.60 | 18 | 5.0E−10 | 2.0E−04 | 4.0E+05 | 2.0E+06 |
| Ex. 17 | 0.52 | 0.56 | 20 | 7.0E−10 | 9.0E−05 | 1.3E+05 | 9.0E+05 |
| Ex. 18 | 0.52 | 0.55 | 23 | 1.0E−09 | 5.0E−05 | 5.0E+04 | 5.0E+05 |
| Ex. 19 | 0.57 | 0.72 | 7 | 1.0E−11 | 5.0E−06 | 5.0E+05 | 5.0E+04 |
| Ex. 20 | 0.57 | 0.70 | 10 | 1.0E−11 | 2.0E−05 | 2.0E+06 | 2.0E+05 |
| Ex. 21 | 0.57 | 0.67 | 12 | 1.0E−11 | 4.0E−05 | 4.0E+06 | 4.0E+05 |
| Ex. 22 | 0.57 | 0.67 | 14 | 1.0E−11 | 6.0E−05 | 6.0E+06 | 6.0E+05 |
| Ex. 23 | 0.57 | 0.65 | 15 | 1.0E−11 | 8.0E−05 | 8.0E+06 | 8.0E+05 |
| Ex. 24 | 0.57 | 0.62 | 17 | 1.0E−11 | 5.0E−05 | 5.0E+06 | 5.0E+05 |
| Ex. 25 | 0.57 | 0.63 | 18 | 8.0E−11 | 7.0E−05 | 8.8E+05 | 7.0E+05 |
| Ex. 26 | 0.57 | 0.62 | 20 | 3.0E−10 | 3.0E−05 | 1.0E+05 | 3.0E+05 |
| Ex. 27 | 0.57 | 0.60 | 23 | 5.0E−09 | 5.0E−05 | 1.0E+04 | 5.0E+05 |
| Ex. 28 | 0.65 | 0.82 | 6 | 1.0E−11 | 7.0E−06 | 7.0E+05 | 7.0E+04 |
| Ex. 29 | 0.65 | 0.78 | 10 | 1.0E−11 | 1.0E−05 | 1.0E+06 | 1.0E+05 |
| Ex. 30 | 0.65 | 0.75 | 14 | 1.0E−11 | 3.0E−05 | 3.0E+06 | 3.0E+05 |
| Ex. 31 | 0.65 | 0.69 | 20 | 1.0E−11 | 2.0E−05 | 2.0E+06 | 2.0E+05 |
| Ex. 32 | 0.65 | 0.65 | 23 | 1.0E−11 | 8.0E−06 | 8.0E+05 | 8.0E+04 |
| Ex. 33 | 0.75 | 0.90 | 8 | 1.0E−11 | 1.0E−06 | 1.0E+05 | 1.0E+04 |
| Ex. 34 | 0.75 | 0.87 | 12 | 1.0E−11 | 6.0E−06 | 6.0E+05 | 6.0E+04 |
| Ex. 35 | 0.75 | 0.85 | 14 | 1.0E−11 | 1.0E−05 | 1.0E+06 | 1.0E+05 |
| Ex. 36 | 0.75 | 0.80 | 17 | 1.0E−11 | 8.0E−06 | 8.0E+05 | 8.0E+04 |
| Ex. 37 | 0.75 | 0.78 | 23 | 1.0E−11 | 2.0E−06 | 2.0E+05 | 2.0E+04 |
| Ex. 38 | 0.85 | 0.98 | 10 | 1.0E−11 | 1.0E−06 | 1.0E+05 | 1.0E+04 |
| Ex. 39 | 0.85 | 0.96 | 12 | 1.0E−11 | 2.0E−06 | 2.0E+05 | 2.0E+04 |
| Ex. 40 | 0.85 | 0.95 | 14 | 1.0E−11 | 5.0E−06 | 5.0E+05 | 5.0E+04 |
| Ex. 41 | 0.85 | 0.92 | 18 | 1.0E−11 | 3.0E−06 | 3.0E+05 | 3.0E+04 |
| Ex. 42 | 0.85 | 0.89 | 20 | 1.0E−11 | 2.0E−06 | 2.0E+05 | 2.0E+04 |
| Ex. 43 | 0.85 | 0.87 | 23 | 1.0E−11 | 3.0E−07 | 3.0E+04 | 3.0E+03 |

Common points: W = 5 μm, Configurations of source and drain electrodes (V-20 nm/Al-80 nm/Mo-50 nm/Au-40 nm)

Comparative Examples 1 to 24

Ultraviolet ray receiving elements of Comparative Examples 1 to 24 were created by the same method as that of Example 1, except setting the Al composition ratio X of the first nitride semiconductor layer containing $Al_XGa_{(1-X)}N$, the Al composition ratio Y of the second nitride semiconductor layer containing $Al_YGa_{(1-Y)}N$, and the film thickness t to values given in Table 2, and then the characteristics of the ultraviolet ray receiving elements were measured by the above-described method. The measurement results are given in Table 2.

TABLE 2

|  | Configuration | | | Measurement results | | | |
|---|---|---|---|---|---|---|---|
|  | X | Y | t (nm) | Dark current (A/mm) | Photocurrent (A/mm) | S/N | Photosensitivity (A/W) |
| Comp. Ex. 1 | 0.47 | 0.66 | 3 | 1.0E−11 | 3.0E−09 | 3.0E+02 | 3.0E+01 |
| Comp. Ex. 2 | 0.47 | 0.48 | 27 | 1.0E−11 | 6.0E−09 | 6.0E+02 | 6.0E+01 |
| Comp. Ex. 3 | 0.47 | 0.61 | 15 | 2.5E−06 | 6.0E−04 | 2.4E+02 | 6.0E+06 |
| Comp. Ex. 4 | 0.47 | 0.50 | 15 | 1.0E−11 | 5.5E−10 | 5.5E+01 | 5.5E+00 |
| Comp. Ex. 5 | 0.52 | 0.70 | 3 | 1.0E−11 | 1.0E−09 | 1.0E+02 | 1.0E+01 |
| Comp. Ex. 6 | 0.52 | 0.53 | 27 | 1.0E−11 | 5.0E−09 | 5.0E+02 | 5.0E+01 |
| Comp. Ex. 7 | 0.52 | 0.66 | 15 | 1.0E−06 | 3.0E−04 | 3.0E+02 | 3.0E+06 |
| Comp. Ex. 8 | 0.52 | 0.55 | 15 | 1.0E−11 | 2.0E−10 | 2.0E+01 | 2.0E+00 |
| Comp. Ex. 9 | 0.57 | 0.77 | 3 | 1.0E−11 | 3.0E−10 | 3.0E+01 | 3.0E+00 |
| Comp. Ex. 10 | 0.57 | 0.60 | 27 | 1.0E−11 | 2.0E−10 | 2.0E+01 | 2.0E+00 |
| Comp. Ex. 11 | 0.57 | 0.71 | 15 | 8.0E−07 | 2.0E−04 | 2.5E+02 | 2.0E+06 |
| Comp. Ex. 12 | 0.57 | 0.61 | 14 | 1.0E−11 | 1.0E−10 | 1.0E+01 | 1.0E+00 |
| Comp. Ex. 13 | 0.65 | 0.85 | 3 | 1.0E−11 | 2.0E−10 | 2.0E+01 | 2.0E+00 |
| Comp. Ex. 14 | 0.65 | 0.65 | 27 | 1.0E−11 | 2.0E−10 | 2.0E+01 | 2.0E+00 |
| Comp. Ex. 15 | 0.65 | 0.80 | 15 | 1.0E−06 | 1.0E−04 | 1.0E+02 | 1.0E+06 |
| Comp. Ex. 16 | 0.65 | 0.65 | 15 | 1.0E−11 | 1.0E−10 | 1.0E+01 | 1.0E+00 |
| Comp. Ex. 17 | 0.75 | 0.92 | 3 | 1.0E−11 | 1.0E−10 | 1.0E+01 | 1.0E+00 |
| Comp. Ex. 18 | 0.75 | 0.75 | 27 | 1.0E−11 | 1.0E−10 | 1.0E+01 | 1.0E+00 |
| Comp. Ex. 19 | 0.75 | 0.75 | 15 | 1.0E−11 | 1.0E−10 | 1.0E+01 | 1.0E+00 |
| Comp. Ex. 20 | 0.75 | 0.90 | 15 | 1.0E−06 | 8.0E−05 | 8.0E+01 | 8.0E+05 |
| Comp. Ex. 21 | 0.85 | 0.95 | 5 | 1.0E−11 | 1.0E−10 | 1.0E+01 | 1.0E+00 |
| Comp. Ex. 22 | 0.85 | 0.85 | 27 | 1.0E−11 | 1.0E−10 | 1.0E+01 | 1.0E+00 |
| Comp. Ex. 23 | 0.85 | 1.00 | 15 | 1.0E−06 | 6.0E−05 | 6.0E+01 | 6.0E+05 |
| Comp. Ex. 24 | 0.85 | 0.85 | 15 | 1.0E−11 | 1.0E−10 | 1.0E+01 | 1.0E+00 |

Common points: W = 5 μm, Configurations of source and drain electrodes (V-20 nm/Al-80 nm/Mo-50 nm/Au-40 nm)

With respect to Examples 1 to 43 and Comparative Examples 1 to 24, the relationship between the Al composition ratio Y and the film thickness t of the second nitride semiconductor layer was graphed for each Al composition ratio X of the first nitride semiconductor layer.

Figure 4:
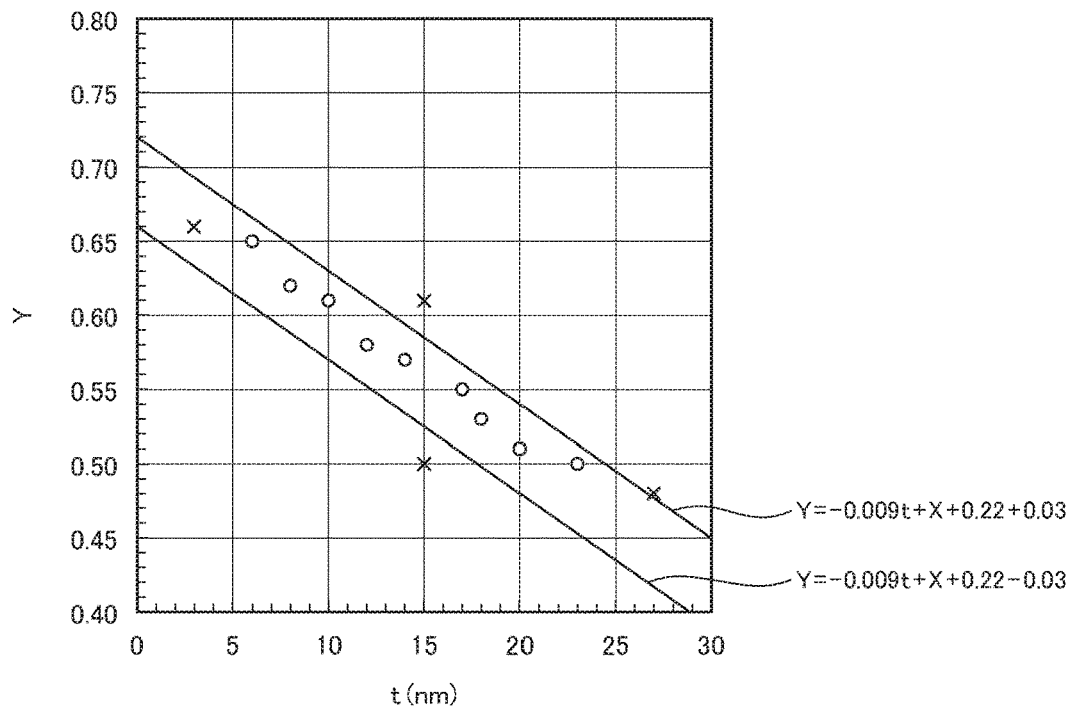
FIG. 4 is a graph created from the data of Examples and illustrates the relationship between an Al composition ratio Y of the second nitride semiconductor layer and a film thickness t when an Al composition ratio X of the first nitride semiconductor layer is 0.47.

FIG. 4 is a graph illustrating the relationship between the Al composition ratio Y and the film thickness t of the second nitride semiconductor layer with respect to Examples 1 to 9 and Comparative Examples 1 to 4 in which X=0.47 was established.

Examples 1 to 9 indicated by "○" in FIG. 4 are present in a range where $-0.009 \times t + X + 0.22 - 0.03 \leq Y \leq -0.009 \times t + X + 0.22 + 0.03$ and $5 \leq t \leq 25$ are satisfied and Comparative Examples 1 to 4 indicated by "x" in FIG. 4 are present at positions outside the range. As given in Tables 1 and 2, the photosensitivity was $8.0 \times 10^4$ A/W or more and the ratio (S/N) of the photocurrent to the dark current was $4.0 \times 10^3$ or more in Examples 1 to 9 but the S/N was $6.0 \times 10^2$ or less in Comparative Examples 1 to 4. The ultraviolet ray receiving element of Comparative Example 3 has an ohmic contact, and therefor is not an MSM ultraviolet ray receiving element.

Figure 5:
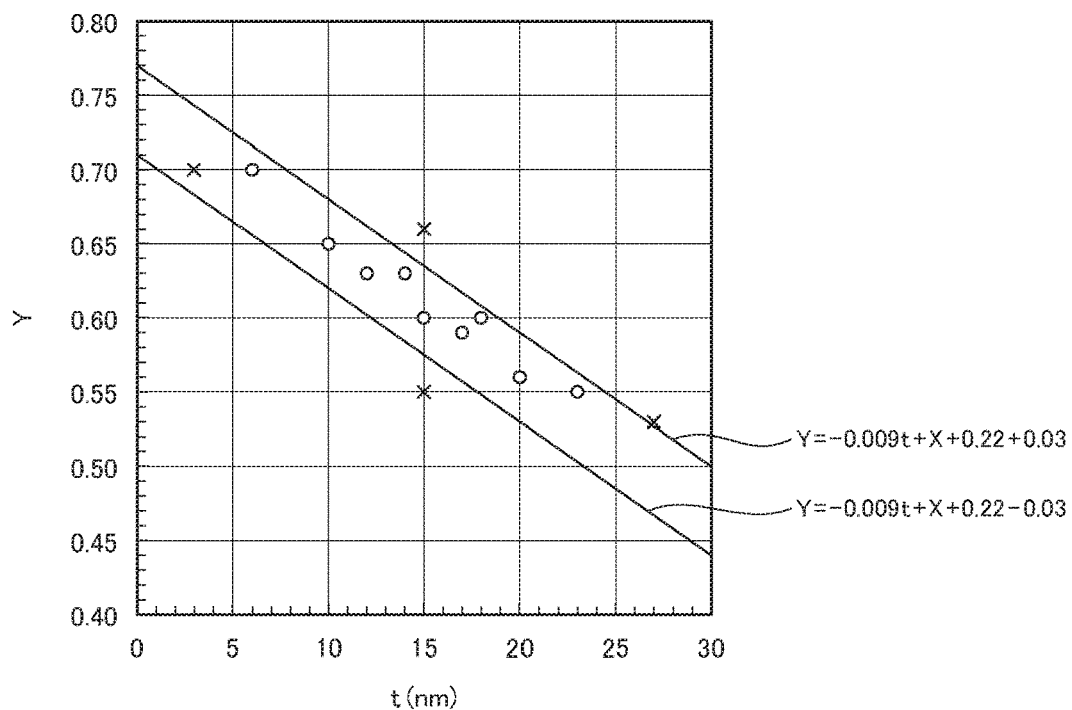
FIG. 5 is a graph created from the data of Examples and illustrates the relationship between the Al composition ratio Y and the film thickness t of the second nitride semiconductor layer when the Al composition ratio X of the first nitride semiconductor layer is 0.52.

FIG. 5 is a graph illustrating the relationship between the Al composition ratio Y and the film thickness t of the second nitride semiconductor layer 4 with respect to Examples 10 to 18 and Comparative Examples 5 to 8 in which X=0.52 was established.

Examples 10 to 18 indicated by "○" in FIG. 5 are present in a range where $-0.009 \times t + X + 0.22 - 0.03 \leq Y \leq -0.009 \times t + X + 0.22 + 0.03$ and $5 \leq t \leq 25$ are satisfied and Comparative Examples 5 to 8 indicated by "x" in FIG. 5 are present at positions outside the range. As given in Tables 1 and 2, the photosensitivity was $1 \times 10^5$ A/W or more and the ratio (S/N) of the photocurrent to the dark current was $5 \times 10^4$ or more in Examples 10 to 18 but the S/N was $5.0 \times 10^2$ or less in Comparative Examples 5 to 8. The ultraviolet ray receiving element of Comparative Example 7 has an ohmic contact, and therefor is not an MSM ultraviolet ray receiving element.

Figure 6:
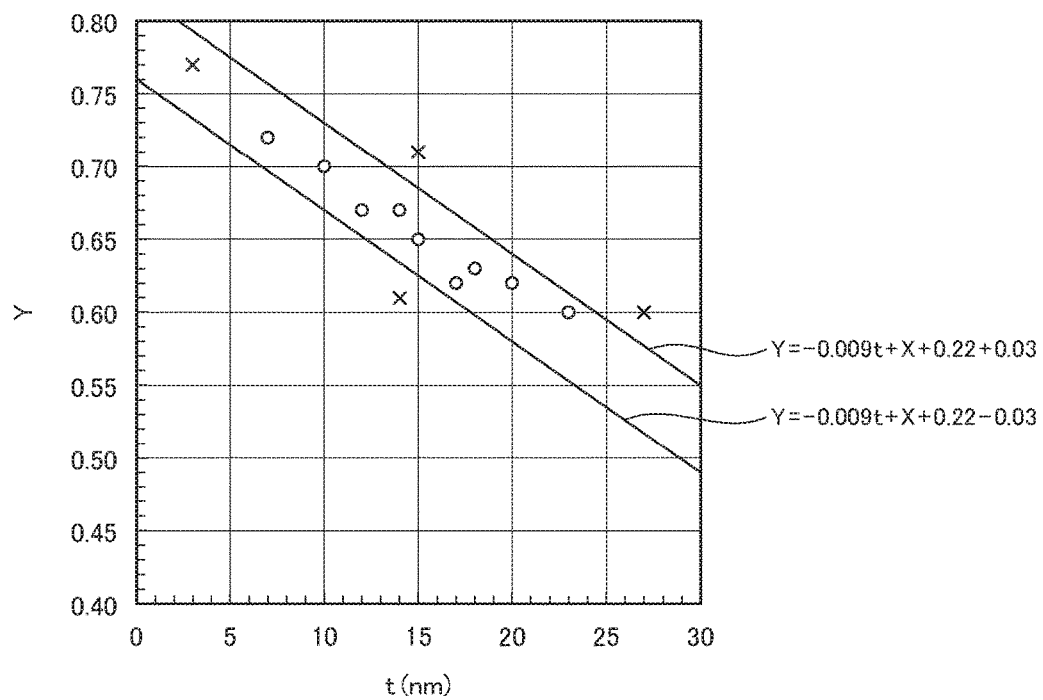
FIG. 6 is a graph created from the data of Examples and illustrates the relationship between the Al composition ratio Y and the film thickness t of the second nitride semiconductor layer when the Al composition ratio X of the first nitride semiconductor layer is 0.57.

FIG. 6 is a graph illustrating the relationship between the Al composition ratio Y and the film thickness t of the second nitride semiconductor layer 4 with respect to Examples 19 to 27 and Comparative Examples 9 to 12 in which X=0.57 was established.

Examples 19 to 27 indicated by "○" in FIG. 6 are present in a range where $-0.009 \times t + X + 0.22 - 0.03 \leq Y \leq -0.009 \times t + X + 0.22 + 0.03$ and $5 \leq t \leq 25$ are satisfied and Comparative Examples 9 to 12 indicated by "x" in FIG. 6 are present at positions outside the range. As given in Tables 1 and 2, the photosensitivity was $5 \times 10^4$ A/W or more and the ratio (S/N) of the photocurrent to the dark current was $1 \times 10^4$ or more in Examples 19 to 27 but the S/N was $2.5 \times 10^2$ or less in Comparative Examples 9 to 12. The ultraviolet ray receiving element of Comparative Example 11 has an ohmic contact, and therefor is not an MSM ultraviolet ray receiving element.

Figure 7:
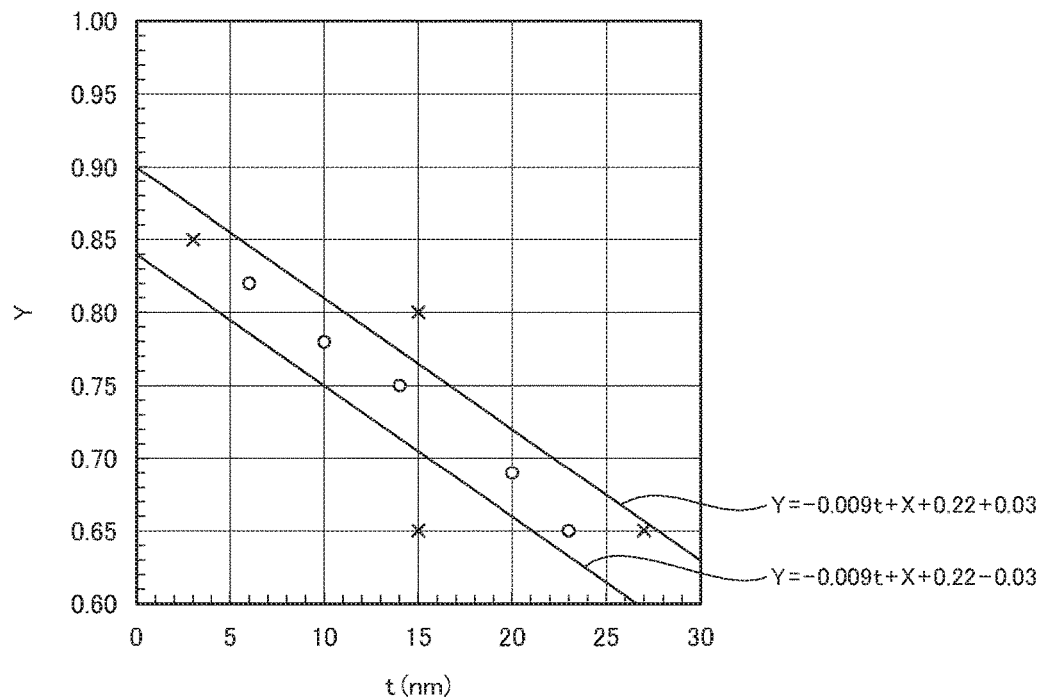
FIG. 7 is a graph created from the data of Examples and illustrates the relationship between the Al composition ratio Y and the film thickness t of the second nitride semiconductor layer when the Al composition ratio X of the first nitride semiconductor layer is 0.65.

FIG. 7 is a graph illustrating the relationship between the Al composition ratio Y and the film thickness t of the second nitride semiconductor layer 4 with respect to Examples 28 to 32 and Comparative Examples 13 to 16 in which X=0.65 was established.

Examples 28 to 32 indicated by "○" in FIG. 7 are present in a range where $-0.009 \times t + X + 0.22 - 0.03 \leq Y \leq -0.009 \times t + X + 0.22 + 0.03$ and $5 \leq t \leq 25$ are satisfied and Comparative Examples 13 to 16 indicated by "x" in FIG. 7 are present at positions outside the range. As given in Tables 1 and 2, the photosensitivity was $7 \times 10^4$ A/W or more and the ratio (S/N) of the photocurrent to the dark current was $7 \times 10^5$ or more in Examples 28 to 32 but the photosensitivity was 2.0 A/W or less and the S/N was $2.0 \times 10$ or less in Comparative Examples 13, 14, and 16. In Comparative Example 15, the photosensitivity was $1.0 \times 10^6$ A/W and the S/N was $1.0 \times 10^2$ A/W but the ultraviolet ray receiving element of Comparative Example 15 has an ohmic contact, and therefore is not an MSM ultraviolet ray receiving element.

FIG. 8 is a graph illustrating the relationship between the Al composition ratio Y and the film thickness t of the second nitride semiconductor layer 4 with respect to Examples 33 to 37 and Comparative Examples 17 to 20 in which X=0.75 was established.

Examples 33 to 37 indicated by "○" in FIG. 8 are present in a range where $-0.009 \times t + X + 0.22 - 0.03 \leq Y \leq -0.009 \times t + X + 0.22 + 0.03$ and $5 \leq t \leq 25$ are satisfied and Comparative Examples 17 to 20 indicated by "x" in FIG. 8 are present at positions outside the range. As given in Tables 1 and 2, the photosensitivity was $1 \times 10^4$ A/W or more and the ratio (S/N) of the photocurrent to the dark current was $1 \times 10^5$ or more in Examples 33 to 37 but the photosensitivity was 1.0 A/W or less and the S/N was 1.0×10 or less in Comparative Examples 17 to 19. In Comparative Example 20, the photosensitivity was $8.0 \times 10^5$ A/W and the S/N was $8.0 \times 10$ A/W but the ultraviolet ray receiving element of Comparative Example 20 has ohmic contact, and therefore is not an MSM ultraviolet ray receiving element.

FIG. 9 is a graph illustrating the relationship between the Al composition ratio Y and the film thickness t of the second nitride semiconductor layer 4 with respect to Examples 38 to 43 and Comparative Examples 21 to 24 in which X=0.85 was established.

Examples 38 to 43 indicated by "○" in FIG. 9 are present in a range where $-0.009 \times t + X + 0.22 - 0.03 \leq Y \leq -0.009 \times t + X + 0.22 + 0.03$ and $5 \leq t \leq 25$ are satisfied and Comparative Examples 21 to 24 indicated by "x" in FIG. 9 are present at positions outside the range. As given in Tables 1 and 2, the photosensitivity was $3 \times 10^3$ A/W or more and the ratio (S/N) of the photocurrent to the dark current was $3 \times 10^3$ or more in Examples 38 to 43 but the photosensitivity was 1.0 A/W or less and the S/N was 1.0×10 or less in Comparative Examples 21, 22, and 24. In Comparative Example 23, the photosensitivity was $6.0 \times 10^5$ A/W and the S/N was $6.0 \times 10$ A/W but the ultraviolet ray receiving element of Comparative Example 23 has ohmic contact, and therefore is not an MSM ultraviolet ray receiving element.

The results above show that, due to the fact that the first nitride semiconductor layer contains $Al_XGa_{(1-X)}N$ ($0.47 \leq X \leq 0.85$) having a thickness of 150 nm, the source and drain electrodes containing V-20 nm/Al-80 nm/Mo-50 nm/Au-40 nm are included, the film thickness t (nm) of the second nitride semiconductor layer satisfies $6 \leq t \leq 23$ (within the range of $5 \leq t \leq 25$), and the Al composition ratio X of the first nitride semiconductor layer, and the Al composition ratio Y and the film thickness t of the second nitride semiconductor layer satisfy Expression (1), the MSM ultraviolet ray receiving elements in which the photosensitivity is $3.0 \times 10^3$ A/W or more and the ratio (S/N) of the photocurrent to the dark current is $4 \times 10^3$ or more when light with a wavelength of 250 nm is incident are obtained.

Figure 10:
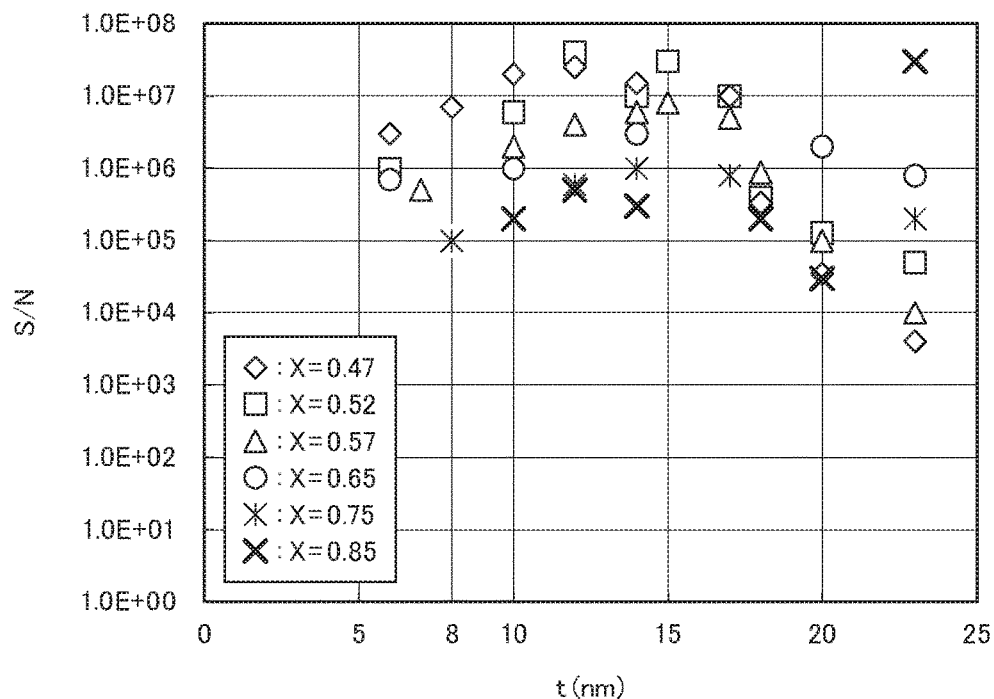
FIG. 10 is a graph created from the data of Examples and illustrates the relationship between the film thickness t of the second nitride semiconductor layer and the S/N of ultraviolet ray receiving elements.
Figure 11:
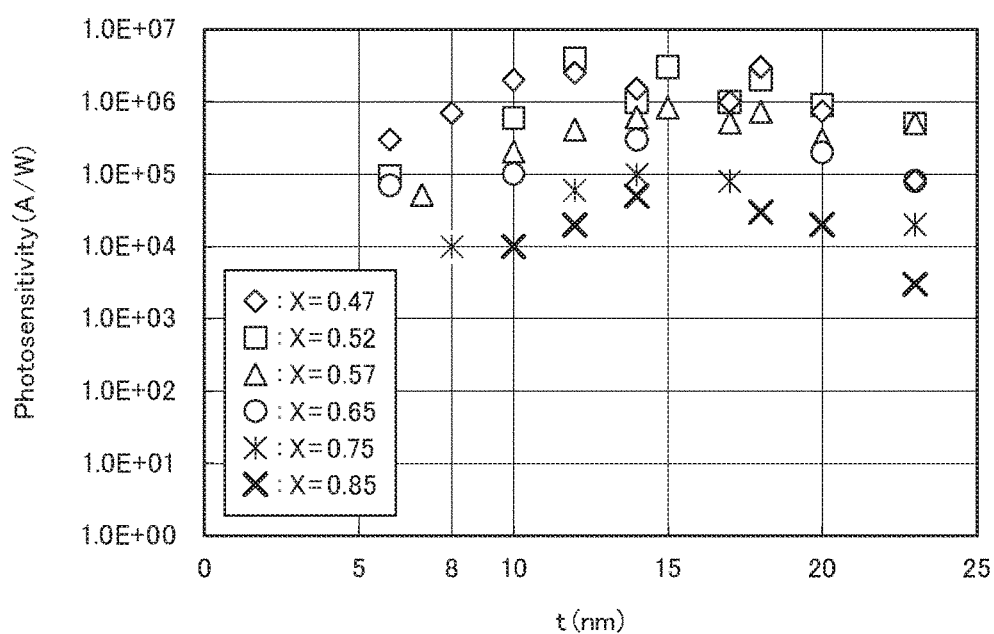
FIG. 11 is a graph created from the data of Examples and illustrates the relationship between the film thickness t of the second nitride semiconductor layer and the photosensitivity of the ultraviolet ray receiving elements.

FIG. 10 is a graph illustrating the relationship between the film thickness t of the second nitride semiconductor layer and the S/N of the ultraviolet ray receiving elements with respect to Examples 1 to 43. FIG. 11 is a graph illustrating the relationship between the film thickness t of the second nitride semiconductor layer and the photosensitivity of the ultraviolet ray receiving elements with respect to Examples 1 to 43.

It is found from the graphs of FIG. 10 and FIG. 11 that, in the examples in which the film thickness t of the second nitride semiconductor layer is 8 nm or more and 20 nm or less among the ultraviolet ray receiving elements of Examples 1 to 43, the photosensitivity is $1 \times 10^4$ A/W or more and the ratio (S/N) of the photocurrent to the dark current is $1 \times 10^4$ or more when light with a wavelength of 250 nm is incident.

Moreover it is found that, due to the fact that the first nitride semiconductor layer contains $Al_XGa_{(1-X)}N$ ($0.47 \leq X \leq 0.57$) having a thickness of 150 nm, the source and drain electrodes containing V-20 nm/Al-80 nm/Mo-50 nm/Au-40 nm are included, the film thickness t (nm) of the second nitride semiconductor layer satisfies $6 \leq t \leq 23$ (within the range of $5 \leq t \leq 25$), and the Al composition ratio X of the first nitride semiconductor layer, and the Al composition ratio Y and the film thickness t of the second nitride semiconductor layer satisfy Expression (1), the MSM ultraviolet ray receiving elements in which the photosensitivity is $5.0 \times 10^4$ A/W or more and the ratio (S/N) of the photocurrent to the dark current is $4 \times 10^3$ or more when light with a wavelength of 250 nm is incident are obtained.

Moreover, it is found that, in the examples in which the film thickness t of the second nitride semiconductor layer is 8 nm or more and 20 nm or less among the ultraviolet ray receiving elements of Examples 1 to 27 satisfying $0.47 \leq X \leq 0.57$ and in the examples in which the film thickness t of the second nitride semiconductor layer is 10 nm or more and 20 nm or less among the ultraviolet ray receiving elements of Examples 1 to 32 satisfying $0.47 \leq X \leq 0.65$, the photosensitivity is $1 \times 10^5$ A/W or more and the ratio (S/N) of the photocurrent to the dark current has is $1 \times 10^4$ or more when light with a wavelength of 250 nm is incident.

Examples 44 to 46

Ultraviolet ray receiving elements of Examples 44 to 46 were created by the same method as that of Example 1, except setting the Al composition ratio X of the first nitride semiconductor layer containing $Al_XGa_{(1-X)}N$ to 0.52, setting the Al composition ratio Y of the second nitride semiconductor layer containing $Al_YGa_{(1-Y)}N$ to 0.60, setting the SD distance W to 2 μm, 10 μm, 25 μm, and 20 μm, and setting the film thickness t to 15 μm, and then the characteristics of the ultraviolet ray receiving elements were measured by the above-described method.

Comparative Examples 25 and 26

Ultraviolet ray receiving elements of Comparative Examples 25 and 26 were created by the same method as that of Example 1, except setting the Al composition ratio X of the first nitride semiconductor layer containing $Al_XGa_{(1-X)}N$ to 0.52, setting the Al composition ratio Y of the second nitride semiconductor layer containing $Al_YGa_{(1-Y)}N$ to 0.70, setting the SD distance W to 0.5 μm and 35 μm, and setting the film thickness t to 3 μm, and then the characteristics of the ultraviolet ray receiving elements were measured by the above-described method.

Examples 47 to 55

Ultraviolet ray receiving elements of Examples 47 to 55 were created by the same method as that of Example 1, except setting the Al composition ratio X of the first nitride semiconductor layer containing $Al_XGa_{(1-X)}N$ to 0.52, setting the Al composition ratio Y of the second nitride semiconductor layer containing $Al_YGa_{(1-Y)}N$ to 0.60, setting the SD distance W (Distance between the source electrode and the drain electrode) to 20 μm, setting the film thickness t to 15 μm, and configuring the source and drain electrodes as given in Table 4, and then the characteristics of the ultraviolet ray receiving elements were measured by the above-described method.

Comparative Examples 27 and 28

Ultraviolet ray receiving elements of Comparative Examples 27 and 28 were created by the same method as that of Example 1, except setting the Al composition ratio X of the first nitride semiconductor layer containing $Al_X Ga_{(1-X)}N$ to 0.52, setting the Al composition ratio Y of the second nitride semiconductor layer containing $Al_Y Ga_{(1-Y)}N$ to 0.62, setting the SD distance W to 5 μm, setting the film thickness t to 15 μm, and configuring the source and drain electrodes as given in Table 4, and then the characteristics of the ultraviolet ray receiving elements were measured by the above-described method.

The configurations and the measurement results of Examples 44 to 55 and Comparative Examples 25 to 28 are given in Tables 3 and 4.

Table 3 collectively illustrates Examples 44 to 46 and Comparative Examples 25 and 26 common in the configuration of the source and drain electrodes. Table 3 illustrates Example 14 having the same configuration except the SD distance W. Table 4 collectively illustrates Examples 47 to 55 in which the SD distance W is 20 μm and Comparative Examples 27 and 28 in which the SD distance W is 5 μm.

The results of Table 3 show the following things. In the case of X=0.52 and Y=0.60, when the SD distance W is 2 μm or more and 25 μm or less, the photosensitivity can be set to $1\times10^5$ A/W or more and the ratio (S/N) of the photocurrent to the dark current can be set to $5\times10^6$ or more ($1\times10^4$ or more) when light with a wavelength of 250 nm is incident. On the other hand, when the SD distance W is 0.5 μm, a short-circuit occurs and when the SD distance W exceeds 35 μm, the photosensitivity and the ratio (S/N) at a wavelength of 250 nm become extremely small.

The results of Table 4 show the following things. When the source and drain electrodes contain alloys containing

TABLE 3

| | Configurations | | | Measurement results | | | B18031 |
| | Y | t (nm) | W (μm) | Dark current (A/mm) | Photocurrent (A/mm) | S/N | Photosensitivity (A/W) |
|---|---|---|---|---|---|---|---|
| Ex. 44 | 0.60 | 15 | 2 | 1.0E−11 | 3.0E−04 | 3.0E+07 | 7.5E+06 |
| Ex. 14 | 0.60 | 15 | 5 | 1.0E−11 | 3.0E−04 | 3.0E+07 | 3.0E+06 |
| Ex. 45 | 0.60 | 15 | 10 | 1.0E−11 | 1.0E−04 | 1.0E+07 | 5.0E+05 |
| Ex. 46 | 0.60 | 15 | 25 | 1.0E−11 | 5.0E−05 | 5.0E+06 | 1.0E+05 |
| Comp. Ex. 25 | 0.70 | 3 | 0.5 | Short-circuit | Short-circuit | N.D. | N.D. |
| Comp. Ex. 26 | 0.70 | 3 | 35 | 1.0E−11 | 2.0E−08 | 2.0E+03 | 2.9E+01 |

Common points: X = 0.52, Configurations of source and drain electrodes (V-20 nm/Al-80 nm/Mo-50 nm/Au-40 nm)

TABLE 4

| | Configurations | | | Measurement results | | | B18031 |
| | Y | Configurations of source and drain electrodes | W (μm) | Dark current (A/mm) | Photocurrent (A/mm) | S/N | Photosensitivity (A/W) |
|---|---|---|---|---|---|---|---|
| Ex. 47 | 0.60 | V-20 nm/Al-80 nm/Ni-50 nm/Au-40 nm | 20 | 1.0E−11 | 3.0E−06 | 3.0E+05 | 7.5E+03 |
| Ex. 48 | 0.60 | Zr-3 nm/V-20 nm/Al-80 nm/Mo-50 nm/Au-40 nm | 20 | 1.0E−11 | 8.0E−04 | 8.0E+07 | 2.0E+06 |
| Ex. 49 | 0.60 | Zr-3 nm/V-20 nm/Al-80 nm/Ni-50 nm/Au-40 nm | 20 | 1.0E−11 | 6.0E−05 | 6.0E+06 | 1.5E+05 |
| Ex. 50 | 0.60 | Ti-20 nm/Al-80 nm/Mo-50 nm/Au-40 nm | 20 | 1.0E−11 | 8.0E−07 | 8.0E+04 | 2.0E+03 |
| Ex. 51 | 0.60 | Nb-20 nm/Al-80 nm/Mo-50 nm/Au-40 nm | 20 | 1.0E−11 | 3.0E−04 | 3.0E+07 | 7.5E+05 |
| Ex. 52 | 0.60 | V-20 nm/Al-80 nm/Hf-50 nm/Au-40 nm | 20 | 1.0E−11 | 8.0E−04 | 8.0E+07 | 2.0E+06 |
| Ex. 53 | 0.60 | V-20 nm/Al-80 nm/W-50 nm/Au-40 nm | 20 | 1.0E−11 | 6.0E−04 | 6.0E+07 | 1.5E+06 |
| Ex. 54 | 0.60 | V-20 nm/Al-80 nm/Ta-50 nm/Au-40 nm | 20 | 1.0E−11 | 7.0E−04 | 7.0E+07 | 1.8E+06 |
| Ex. 55 | 0.60 | Ti-20 nm/Al-80 nm/Ni-50 nm/Au-40 nm | 20 | 1.0E−11 | 3.0E−07 | 3.0E+04 | 7.5E+02 |
| Comp. Ex. 27 | 0.62 | Ti-20 mn/Au-40 mn | 5 | 1.0E−11 | 1.0E−11 | 1.0E+00 | 1.0E−01 |
| Comp. Ex. 28 | 0.62 | Ni-20 nm/Au-40 mn | 5 | 1.0E−11 | 1.0E−11 | 1.0E+00 | 1.0E−01 |

Common points: X = 0.52, t = 15 nm four or five metals selected from Ti, Al, Au, Ni, V, Mo, and Zr (Examples 47 to 55), the photosensitivity and the ratio (S/N) at a wavelength of 250 nm are higher than those when the source and drain electrodes contain alloys containing two metals (Comparative Examples 27 and 28).

Moreover, the ultraviolet ray receiving element of Example 49 has the source and drain electrodes of a configuration of further having Zr on the V side of Example 47, and therefore the photosensitivity at a wavelength of 250 nm is $1.5 \times 10^5$ A/W, and thus the photosensitivity remarkably higher than $7.5 \times 10^3$ A/W of Example 47 can be obtained.

Furthermore, when the source and drain electrodes contain alloys containing five metals (Examples 48 and 49) and when any one of Nb, Hf, W and Ta is contained in the alloys configuring the source and drain electrodes (Examples 51 to 54), the photosensitivity at a wavelength of 250 nm can be set to $1 \times 10^5$ A/W or more.

1 MSM ultraviolet ray receiving element
2 substrate
3 first nitride semiconductor layer
4 second nitride semiconductor layer
5 first electrode (source electrode)
51 base portion
52 teeth
6 second electrode (drain electrode)
61 base portion
62 teeth
7 mounting substrate
10 MSM ultraviolet ray receiving device

What is claimed is:

1. An MSM ultraviolet ray receiving element comprising:
a substrate;
a first nitride semiconductor layer formed on the substrate and containing $Al_XGa_{(1-X)}N$ ($0.45 \leq X \leq 0.90$);
a second nitride semiconductor layer formed on the first nitride semiconductor layer, containing $Al_YGa_{(1-Y)}N$ ($Y \leq 1$), and having a film thickness t (nm) satisfying $5 \leq t \leq 25$; and
a first electrode and a second electrode formed on the second nitride semiconductor layer and containing a material containing at least three elements of Ti, Al, Au, Ni, V, Mo, Hf, Ta, W, Nb, Zn, Ag, Cr, and Zr, wherein
an Al composition ratio X of the first nitride semiconductor layer, and an Al composition ratio Y and a film thickness t of the second nitride semiconductor layer satisfy a following Expression (1);

$$-0.009 \times t + X + 0.22 - 0.03 \leq Y \leq -0.009 \times t + X + 0.22 + 0.03 \quad (1), \text{ and}$$

a Schottky junction disposed between the second nitride semiconductor layer and the first and second electrodes, the Schottky junction being configured to disappear when ultraviolet rays are incident on the second nitride semiconductor layer.

2. The MSM ultraviolet ray receiving element according to claim 1, wherein
the first nitride semiconductor layer contains $Al_XGa_{(1-X)}N$ ($0.48 \leq X \leq 0.60$).

3. The MSM ultraviolet ray receiving element according to claim 1, wherein
the film thickness t of the second nitride semiconductor layer satisfies $10 \leq t \leq 20$.

4. An MSM ultraviolet ray receiving element comprising:
a substrate;
a first nitride semiconductor layer formed on the substrate and containing $Al_XGa_{(1-X)}N$ ($0.45 \leq X \leq 0.90$);
a second nitride semiconductor layer formed on the first nitride semiconductor layer, containing $Al_YGa_{(1-Y)}N$ ($Y \leq 1$), and having a film thickness t (nm) satisfying $5 \leq t \leq 25$; and
a first electrode and a second electrode formed on the second nitride semiconductor layer and containing a material containing at least three elements of Ti, Al, Au, Ni, V, Mo, Hf, Ta, W, Nb, Zn, Ag, Cr, and Zr, wherein
an Al composition ratio X of the first nitride semiconductor layer, and an Al composition ratio Y and a film thickness t of the second nitride semiconductor layer satisfy a following Expression (1);

$$-0.009 \times t + X + 0.22 - 0.03 \leq Y \leq -0.009 \times t + X + 0.22 + 0.03 \quad (1), \text{ and}$$

the first electrode and the second electrode each include a comb-like portion from a base portion of which a plurality of teeth projects, and
the teeth of the first electrode and the teeth of the second electrode are arranged to be alternately adjacent to each other as viewed in plan.

5. The MSM ultraviolet ray receiving element according to claim 1, wherein
the first electrode and the second electrode contain at least Al, Mo, and Au.

6. The MSM ultraviolet ray receiving element according to claim 1, wherein
a film thickness of the first nitride semiconductor layer is 20 nm or more and 1000 nm or less.

7. An MSM ultraviolet ray receiving element comprising:
a substrate;
a first nitride semiconductor layer formed on the substrate and containing $Al_XGa_{(1-X)}N$ ($0.45 \leq X \leq 0.90$);
a second nitride semiconductor layer formed on the first nitride semiconductor layer, containing $Al_YGa_{(1-Y)}N$ ($Y \leq 1$), and having a film thickness t (nm) satisfying $5 \leq t \leq 25$; and
a first electrode and a second electrode formed on the second nitride semiconductor layer and containing a material containing at least three elements of Ti, Al, Au, Ni, V, Mo, Hf, Ta, W, Nb, Zn, Ag, Cr, and Zr, wherein
an Al composition ratio X of the first nitride semiconductor layer, and an Al composition ratio Y and a film thickness t of the second nitride semiconductor layer satisfy a following Expression (1);

$$-0.009 \times t + X + 0.22 - 0.03 \leq Y \leq -0.009 \times t + X + 0.22 + 0.03 \quad (1), \text{ and}$$

a two-dimensional electron gas layer with an electron density of $1 \times 10^{11}$ cm$^{-2}$ or more and $6 \times 10^{12}$ cm$^{-2}$ or less is present on an interface between the first nitride semiconductor layer and the second nitride semiconductor layer.

8. The MSM ultraviolet ray receiving element according to claim 7, wherein
a thickness of the two-dimensional electron gas layer is 2 nm or more and 30 nm or less.

9. The MSM ultraviolet ray receiving element according to claim 1, wherein
a wavelength λ (nm) of luminescence caused by photoluminescence and the Al composition ratio X of the first nitride semiconductor layer satisfy a following Expression (2);

$$1.24 \times 10^{-3}/(X^2 + 1.86X + 3.42) - 10 \leq \lambda \leq 1.24 \times 10^{-3}/(X^2 + 1.86X + 3.42) + 10 \quad (2).$$

10. The MSM ultraviolet ray receiving element according to claim 1, wherein a height of a Schottky barrier in irradiation with ultraviolet rays with a wavelength of 250 nm is 0.1 eV or more and 0.5 eV or less.

11. The MSM ultraviolet ray receiving element according to claim 1, wherein
a distance between the first electrode and the second electrode is 1.0 μm or more and 30 μm or less.

12. The MSM ultraviolet ray receiving element according to claim 1, wherein
the substrate is any one of a sapphire substrate, an AlN substrate, and a GaN substrate.

13. The MSM ultraviolet ray receiving element according to claim 1, wherein
photosensitivity is $1\times10^5$ A/W or more, and a ratio (S/N) of a photocurrent to a dark current is $1\times10^4$ or more in irradiation with ultraviolet rays with a wavelength of 250 nm.

14. The MSM ultraviolet ray receiving element according to claim 1, wherein
the substrate is an AlN substrate or a sapphire substrate, and
absorption coefficient to ultraviolet rays with a wavelength of 265 nm of the substrate is 5 $cm^{-1}$ or more and 50 $cm^{-1}$ or less.

15. The MSM ultraviolet ray receiving element according to claim 1, wherein
a light reception area is 500 $μm^2$ or more and 15000 $μm^2$ or less.

16. The MSM ultraviolet ray receiving element according to claim 1, wherein
a relaxation ratio to the substrate in a (10-12) plane which is an asymmetrical plane of crystal configuring the first nitride semiconductor layer is 0% or more and 5% or less.

17. The MSM ultraviolet ray receiving element according to claim 1, wherein
a half value width of an XRD rocking curve in the (10-12) plane which is the asymmetrical plane of the crystal configuring the first nitride semiconductor layer is 50 arcsec or more and 1000 arcsec or less.

18. The MSM ultraviolet ray receiving element according to claim 1, wherein
fall time to ultraviolet rays with a wavelength of 250 nm is 0.1 μsec or more and 1 msec or less.

19. An MSM ultraviolet ray receiving device comprising:
the MSM ultraviolet ray receiving element according to claim 1; and
a mounting substrate, wherein
the MSM ultraviolet ray receiving element is flip-chip mounted on the mounting substrate.

20. The MSM ultraviolet ray receiving element according to claim 2, wherein
the film thickness t of the second nitride semiconductor layer satisfies $10 \leq t \leq 20$.

* * * * *